United States Patent
Hu

(10) Patent No.: US 12,471,419 B2
(45) Date of Patent: Nov. 11, 2025

(54) LED DISPLAY PANEL AND DISPLAY DEVICE

(71) Applicant: TCL China Star Optoelectronics Technology Co., Ltd., Guangdong (CN)

(72) Inventor: Daobing Hu, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 581 days.

(21) Appl. No.: 17/898,543

(22) Filed: Aug. 30, 2022

(65) Prior Publication Data

US 2024/0038944 A1 Feb. 1, 2024

(30) Foreign Application Priority Data

Jul. 27, 2022 (CN) .......................... 202210893979.4

(51) Int. Cl.
*H10H 20/855* (2025.01)
*H01L 25/075* (2006.01)

(52) U.S. Cl.
CPC ....... *H10H 20/855* (2025.01); *H01L 25/0753* (2013.01)

(58) Field of Classification Search
CPC .... G02F 1/133603; G09F 9/33; H10H 20/856
USPC .......................................... 257/79
See application file for complete search history.

(56) References Cited

U.S. PATENT DOCUMENTS

| | | | |
|---|---|---|---|
| 2013/0214301 A1 | 8/2013 | Yamada et al. | |
| 2022/0043305 A1* | 2/2022 | Lee | G02F 1/133605 |
| 2022/0085334 A1* | 3/2022 | Oh | H10K 59/871 |

FOREIGN PATENT DOCUMENTS

| | | |
|---|---|---|
| CN | 107247365 | 10/2017 |
| CN | 107579166 | 1/2018 |
| CN | 113641023 | 11/2021 |
| CN | 114038340 | 2/2022 |
| CN | 114335131 | 4/2022 |
| CN | 114783289 | 7/2022 |
| WO | WO 2020/029632 | 2/2020 |

OTHER PUBLICATIONS

Notification of Office Action and Search Report Dated May 12, 2023 From The State Intellectual Property Office of the People's Republic of China Re. Application No. 202210893979.4 and Its Translation Into English. (19 Pages).

* cited by examiner

*Primary Examiner* — Ratisha Mehta
*Assistant Examiner* — Mikka Liu

(57) ABSTRACT

A LED display panel includes a substrate, a light source assembly disposed on the substrate, and a light filter layer disposed on the light source assembly. The light filter layer includes a light filter region. The light filter region includes a light-transmitting region and a non-light-transmitting region disposed outside the light-transmitting region. An incident angle of a light emitted by the light source assembly to the light-transmitting region is less than a total reflection critical angle of the light filter layer, and an incident angle of the light emitted by the light source assembly to the non-light-transmitting region is greater than or equal to the total reflection critical angle of the light filter layer. The total reflection critical angle is a critical angle at which the light exits from an upper surface of the light filter layer. A display device includes the LED display panel.

20 Claims, 4 Drawing Sheets

LED DISPLAY PANEL AND DISPLAY DEVICE

RELATED APPLICATION

This application claims the benefit of priority of Chinese Patent Application No. 202210893979.4 filed on Jul. 27, 2022, the contents of which are incorporated by reference as if fully set forth herein in their entirety.

FIELD OF INVENTION

The present disclosure relates to the technical field of display, and particularly to a LED display panel and a display device.

BACKGROUND

With the rapid development of the outdoor display market, large size and high resolution have become a development direction of outdoor display. Conventional LCDs not only have low cost, but also have high resolution, but after forming a splicing screen, seams between the conventional LCDs cannot be eliminated, which affects a visual effect. Currently, Mini-LEDs/Micro-LEDs still have immature small pitch technology, have lower resolution than LCDs, and have a high cost. Therefore, solving a problem that an LCD splicing screen has seams has become a key breakthrough point and needs to be solved urgently. At present, there is a splicing screen composed of LEDs and LCDs, in which the LEDs eliminate seams between the LCDs, thereby improving a quality of the splicing screen. However, because a display viewing angle of the LEDs is much greater than a display viewing angle of the LCDs, there is a significant difference in brightness between the LEDs and the LCDs when viewed from a side. Therefore, how to make a viewing angle of a LED display panel adjustable is very important.

SUMMARY OF DISCLOSURE

The present disclosure provides a LED display panel and a display device, in which a viewing angle of the LED display panel can be adjusted by setting a boundary between a light-transmitting region and a non-light-transmitting region in a light filter layer.

In a first aspect, the present disclosure provides an LED display panel, which comprises a substrate, a light source assembly, and a light filter layer. The light source assembly is disposed on the substrate. The light filter layer is disposed on the light source assembly and comprises a light filter region. The light filter region comprises a light-transmitting region and a non-light-transmitting region. The non-light-transmitting region is disposed outside the light-transmitting region. An incident angle of a light emitted by the light source assembly to the light-transmitting region is less than a total reflection critical angle of the light filter layer, and an incident angle of the light emitted by the light source assembly to the non-light-transmitting region is greater than or equal to the total reflection critical angle of the light filter layer. The total reflection critical angle is a critical angle at which the light exits from an upper surface of the light filter layer.

In some embodiments, a part of the upper surface corresponding to the light filter region is shaped as a curved surface or a flat surface.

In some embodiments, a refractive index of the light filter layer is greater than a refractive index of a medium outside the upper surface of the light filter layer.

In some embodiments, a centerline of the light-transmitting region coincides with a centerline of the light source assembly.

In some embodiments, the light filter layer is colorless and transparent.

In some embodiments, the light source assembly comprises two or more light-emitting sources, the light filter layer comprises two or more light filter regions disposed corresponding to the light-emitting sources, and the LED display panel further comprises one or more baffles disposed between the light-emitting sources.

In some embodiments, the non-light-transmitting region is disposed around the light-transmitting region.

In some embodiments, the baffles are disposed between the substrate and the light filter layer, one end of each of the baffles is in contact with the substrate, and another end of each of the baffles is in contact with the light filter layer.

In some embodiments, the non-light-transmitting region of the light filter layer is provided with a non-light-transmitting coating.

In a second aspect, the present disclosure further provides a display device, which comprises two or more LCD display panels and the aforementioned LED display panel. The LED display panel is disposed between adjacent LCD display panels. A light-emitting angle of the light emitted by the light source assembly passing through the light-transmitting region is similar to or same as a viewing angle of the LCD display panels.

In some embodiments, the LED display panel comprises a substrate, a light source assembly, and a light filter layer. The light source assembly is disposed on the substrate. The light filter layer is disposed on the light source assembly and comprises a light filter region. The light filter region comprises a light-transmitting region and a non-light-transmitting region. The non-light-transmitting region is disposed outside the light-transmitting region. An incident angle of a light emitted by the light source assembly to the light-transmitting region is less than a total reflection critical angle of the light filter layer, and an incident angle of the light emitted by the light source assembly to the non-light-transmitting region is greater than or equal to the total reflection critical angle of the light filter layer. The total reflection critical angle is a critical angle at which the light exits from an upper surface of the light filter layer.

In some embodiments, a part of the upper surface corresponding to the light filter region is shaped as a curved surface or a flat surface.

In some embodiments, a refractive index of the light filter layer is greater than a refractive index of a medium outside the upper surface of the light filter layer.

In some embodiments, a centerline of the light-transmitting region coincides with a centerline of the light source assembly.

In some embodiments, the light filter layer is colorless and transparent.

In some embodiments, the light source assembly comprises two or more light-emitting sources, the light filter layer comprises two or more light filter regions disposed corresponding to the light-emitting sources, and the LED display panel further comprises one or more baffles disposed between the light-emitting sources.

In some embodiments, the non-light-transmitting region is disposed around the light-transmitting region.

In some embodiments, the baffles are disposed between the substrate and the light filter layer, one end of each of the baffles is in contact with the substrate, and another end of each of the baffles is in contact with the light filter layer.

In some embodiments, the non-light-transmitting region of the light filter layer is provided with a non-light-transmitting coating.

In the LED display panel and the display device provided by the present disclosure, the light filter region of the light filter layer is set as the light-transmitting region and the non-light-transmitting region, and the light is only emitted from the light-transmitting region of the light filter layer. The light-transmitting region and the non-light-transmitting region are set according to a relationship between the incident angle of the light emitted by the light source assembly and the total reflection critical angle of the light filter layer. A position of a boundary between the light-transmitting region and the non-light-transmitting region determines a viewing angle of the LED display panel. That is, the viewing angle of the LED display panel can be adjusted by setting the boundary between the light-transmitting region and the non-light-transmitting region of the light filter layer.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Figure 1:
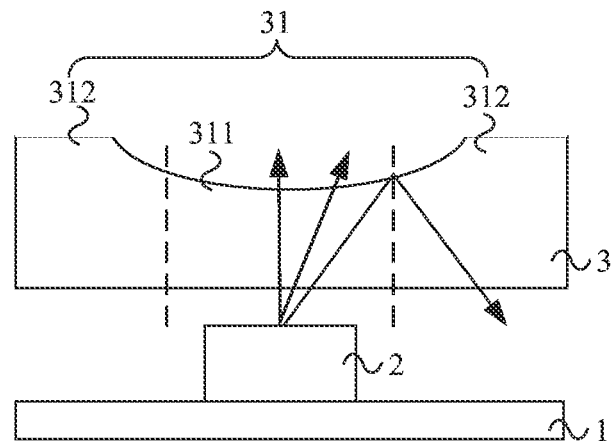
FIG. 1 is a schematic structural diagram of a LED display panel according to an embodiment of the present disclosure.

Technical solutions in embodiments of the present disclosure will be clearly and completely described below in conjunction with accompanying drawings in the embodiments of the present disclosure. It is apparent that the described embodiments are merely some of the embodiments of the present disclosure and not all embodiments. All other embodiments obtained by those skilled in the art based on the embodiments of the present disclosure without creative labor are within claimed scope of the present disclosure.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "within", "outside", "clockwise", and "counterclockwise", are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection, an electrical connection, or a mutual communication. A connection may be a direct connection or may be an indirect connection by using an intermediate medium. A connection may be an internal connection or an interaction between two elements. It may be appreciated by those of ordinary skill in the art that the specific meanings of the aforementioned terms in the present disclosure can be understood depending on specific situations.

In the present disclosure, unless otherwise specifically specified or limited, a structure in which a first feature is "on" or "under" a second feature may comprise an embodiment in which the first feature directly contacts the second feature, and may also comprise an embodiment in which the first feature and the second feature are not in direct contact with each other, but are contacted via an additional feature formed therebetween. Furthermore, a structure in which a first feature is "on", "above", or "on top of" a second feature may comprise an embodiment in which the first feature is right or obliquely "on", "above", or "on top of" the second feature, or just means that a sea-level elevation of the first feature is greater than a sea-level elevation of the second feature. A structure in which a first feature "under", "below", or "on bottom of" a second feature may include an embodiment in which the first feature is right "beneath," "below," or "on bottom of" the second feature, and may also comprises an embodiment in which the first feature is right or obliquely "under", "below", or "on bottom of" the second feature, or just means that a sea-level elevation of the first feature is less than a sea-level elevation of the second feature.

The following description provides different embodiments or examples illustrating various structures of the present invention. In order to simplify the description of the present disclosure, only components and settings of specific examples are described below. They are only examples and are not intended to limit the present invention. Furthermore, reference numerals and/or letters may be repeated in different examples of the present disclosure. Such repetitions are for simplicity and clarity, which per se do not indicate relations among the discussed embodiments and/or settings. Furthermore, the present disclosure provides various examples of specific processes and materials, but those skilled in the art can be aware of application of other processes and/or use of other materials.

Please refer to FIG. 1, the present disclosure provides a LED display panel. The LED display panel comprises a substrate 1, a light source assembly 2, and a light filter layer 3. In order to avoid light leakage of the light source assembly 2, the substrate 1 is set to be opaque. The light source assembly 2 is disposed on the substrate 1, and the light filter layer 3 is disposed on the light source assembly 2. Because a certain space is required between the light source assembly 2 and the light filter layer 3 to emit light, a bottom of the light filter layer 3 cannot directly contact a top of the light source assembly 2. Therefore, if it is inconvenient for the light source assembly 2 to be directly fixedly connected to the light filter layer 3, the light filter layer 3 may be fixedly connected to the substrate 1, and then the light source assembly 2 is disposed between the light filter layer 3 and the substrate 1.

The light filter layer 3 comprises a light filter region 31. The light filter region 31 comprises a light-transmitting region 311 and a non-light-transmitting region 312. The light filter layer 3 further comprises a light incident surface and a light exit surface. A light emitted by the light source assembly 2 enters the light-transmitting region 311 and the non-light-transmitting region 312 of the light filter region 31 from the light incident surface. The light source assembly 2 is disposed at a position closer to the light-transmitting region 311 than the non-light-transmitting region 312. Therefore, when the light emitted by the light source assembly 2 enters the light exit surface, the light emitted by the light source assembly 2 is restricted to be emitted in a small range. For example, as shown in FIG. 1, the light emitted by the light source assembly 2 is limited to approximately a point. The non-light-transmitting region 312 is disposed outside the light-transmitting region 311. That is, the non-light-transmitting region 312 is disposed away from a center of the light filter layer 3. That is, for the light source assembly 2, a part of the light exit surface corresponding to the non-light-transmitting region 312 is farther than a part of the light exit surface corresponding to the light-transmitting region 311. Therefore, an incident angle of the light emitted by the light source assembly 2 to the non-light-transmitting region 312 is greater than an incident angle of the light emitted by the light source assembly 2 to the light-transmitting region 311. By setting shapes of parts of the light exit surface corresponding to the light-transmitting region 311 and the non-light-transmitting region 312, a light incident angle at a boundary between the light-transmitting region 311 and the non-light-transmitting region 312 is set as a total reflection critical angle of the light filter layer 3. Therefore, the incident angle of the light emitted by the light source assembly 2 to the light-transmitting region 311 is less than the total reflection critical angle of the light filter layer 3, and the incident angle of the light emitted by the light source assembly 2 to the non-light-transmitting region 312 is greater than or equal to the total reflection critical angle of the light filter layer 3. That is, the light emitted by the light source assembly 2 is totally reflected when it enters the non-light-transmitting region 312 of the light filter layer 3. Therefore, the light emitted by the light source assembly 2 cannot be emitted from the non-light-transmitting region 312 of the light filter region 31, but can only be emitted from the light-transmitting region 311.

It should be noted that in order to minimize a loss of the light emitted by the light source assembly 2 in the light filter layer 3, the light filter layer 3 is set to be colorless and transparent.

In this embodiment, a position of a boundary between the light-transmitting region 311 and the non-light-transmitting region 312 of the light filter layer 3 determines an exit angle of the light emitted by the light source assembly 2, that is, determines a viewing angle of the LED display panel. Accordingly, the viewing angle of the LED display panel can be adjusted by setting the boundary between the light-transmitting region 311 and the non-light-transmitting region 312 of the light filter layer 3.

In an embodiment, the light source assembly 2 is disposed corresponding to the light-transmitting region 311. In addition, in order to prevent the light emitted by the light source assembly 2 from being emitted from the non-light-transmitting region 312, a light-emitting region of the light source assembly 2 is less than an area of the light-transmitting region 311, so that the light emitted by the light source assembly 2 can be totally reflected in the non-light-transmitting region 312. The non-light-transmitting region 312 is disposed outside the light-transmitting region 311. That is, in the light filter layer 3, a viewing angle in a direction in which the non-light-transmitting region 312 is disposed is greater than a viewing angle in a direction in which the non-light-transmitting region 312 is not disposed. In order to realize a multi-directional adjustable viewing angle, the non-light-transmitting region 312 is disposed around the light-transmitting region 311.

Figure 2:
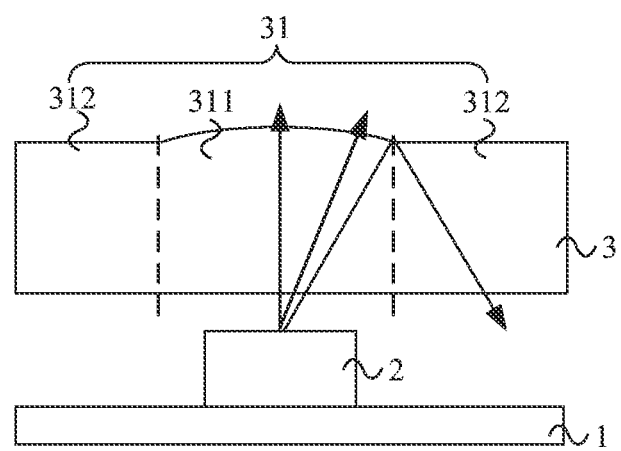
FIG. 2 is a schematic structural diagram of a LED display panel according to an embodiment of the present disclosure.
Figure 3:
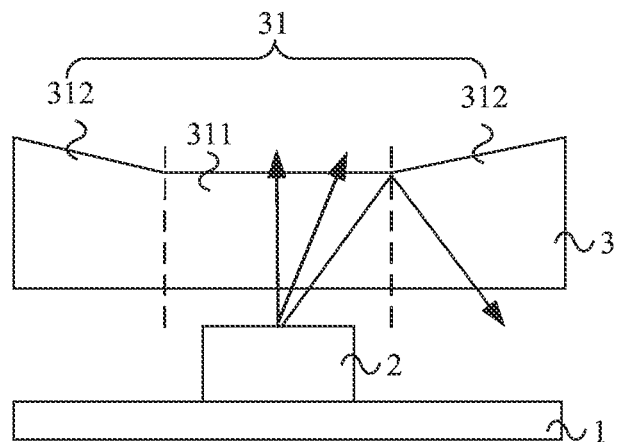
FIG. 3 is a schematic structural diagram of a LED display panel according to an embodiment of the present disclosure.
Figure 4:
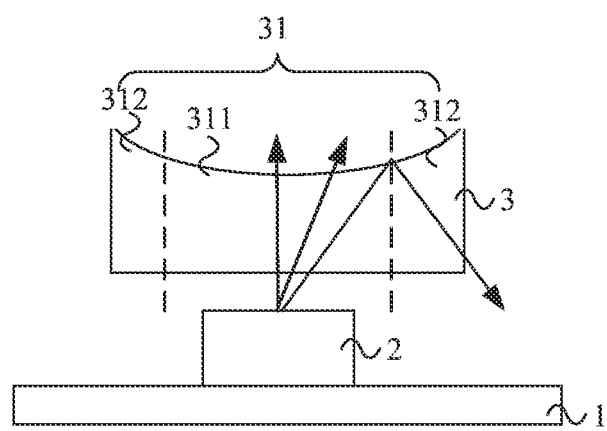
FIG. 4 is a schematic structural diagram of a LED display panel according to an embodiment of the present disclosure.

Because the light emitted by the light source assembly 2 is dispersive, the light emitted by the light source assembly 2 enters the light filter layer 3 and then exits through the light filter layer 3. Please refer to FIG. 1 to FIG. 8, the light exit surface of the light filter layer 3 is an upper surface of the light filter layer 3. A part of the upper surface corresponding to the light-transmitting region 311 is set as a curved surface (as shown in FIG. 1 and FIG. 2), a flat surface (as shown in FIG. 3), or a folded surface formed by splicing a curved surface and a flat surface (not shown). When the part of the upper surface corresponding to the light-transmitting region 311 is set as a curved surface, it may be a concave surface (as shown in FIG. 1) or a convex surface (as shown in FIG. 2). The folded surface is formed by splicing various types of surfaces. For example, the part of the upper surface corresponding to the light-transmitting region 311 is set as a folded surface formed by splicing a curved surface and a flat surface. The splicing can be flexible, it may be splicing of a curved surface and a curved surface, splicing of a curved surface and a flat surface, or splicing of a flat surface and a flat surface. Furthermore, a part of the upper surface corresponding to the non-light-transmitting region 312 is set as a curved surface (as shown in FIG. 4), a flat surface (as shown in FIG. 2 and FIG. 3), or a folded surface formed by splicing a curved surface and a flat surface (as shown in FIG. 1). In FIG. 1, a part of the upper surface corresponding to a portion of the non-light-transmitting region 312 close to the light-transmitting region 311 is a curved surface, and a part of the upper surface corresponding to a portion of the non-light-transmitting region 312 away from the light-transmitting region 311 is a flat surface. In addition to a splicing method of the folded surface shown in FIG. 1, the splicing method can be flexibly set according to different needs.

Furthermore, if a part of the upper surface at the boundary between the light-transmitting region 311 and the non-light-transmitting region 312 does not have a smooth transition, a fabrication process may be more complicated, and implementation is more difficult. Accordingly, adjacent parts of the light-transmitting region 311 and the non-light-transmitting region 312 may have a curved surface with smooth transition, which makes preparation of the light filter layer 3 easier. Other parts of the light-transmitting region 311 and the non-light-transmitting region 312 may have curved surfaces or flat surfaces, which are not specifically limited in this embodiment.

In an embodiment, a refractive index of the light filter layer 3 and a refractive index of a medium outside the upper surface of the light filter layer 3 determine the total reflection critical angle of the light filter layer 3. The refractive index of the light filter layer 3 is greater than the refractive index of the medium outside the upper surface of the light filter layer 3, so that the light emitted by the light source assembly 2 may be totally reflected on the upper surface after entering the light filter layer 3. It should be noted that the medium outside the upper surface of the light filter layer 3 is generally air, but may also be another medium, which is not limited in this embodiment.

Generally, viewing angles on opposite sides of the LED display panel are same. For example, a left side and a right side of the LED display panel have a same viewing angle. Accordingly, in an embodiment, in order to achieve uniform viewing angles, the light-transmitting region 311 is set as a symmetrical structure, so that viewing angles of the LED display panel are symmetrical. In addition, a centerline of the light-transmitting region 311 coincides with a centerline of the light source assembly 2, so that the light emitted by the light source assembly 2 is evenly and symmetrically distributed to the light-transmitting region 311, which avoids asymmetric light intensity distribution, and thus prevents viewing angle effects from being affected.

Figure 5:
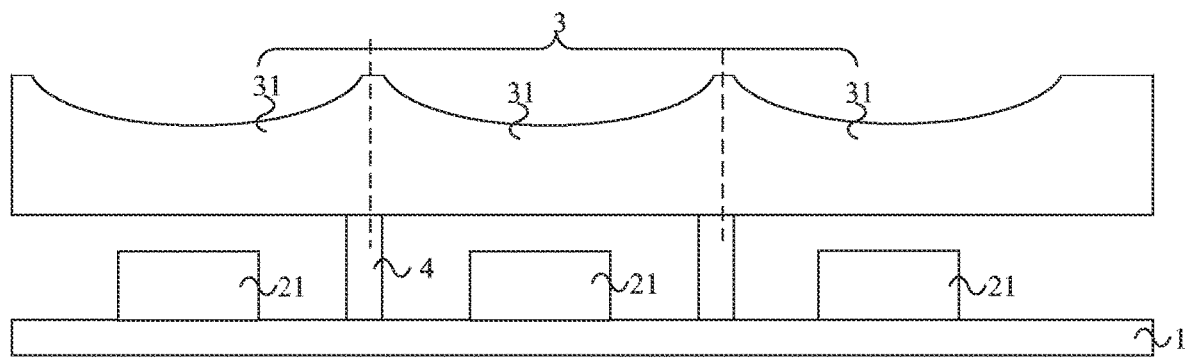
FIG. 5 is a schematic structural diagram of a LED display panel according to an embodiment of the present disclosure.

In an embodiment, each pixel of the LED display panel is controlled to emit light independently. That is, each pixel corresponds to its own light-emitting source 21. Accordingly, as shown in FIG. 5, the light source assembly 2 comprises two or more light-emitting sources 21. Correspondingly, the light filter layer 3 comprises two or more light filter regions 31 disposed corresponding to the light-emitting sources 21. The light-emitting sources 21 are in one-to-one correspondence with the light filter regions 31. The light-emitting sources 21 may be LED light-emitting chips.

Figure 6:
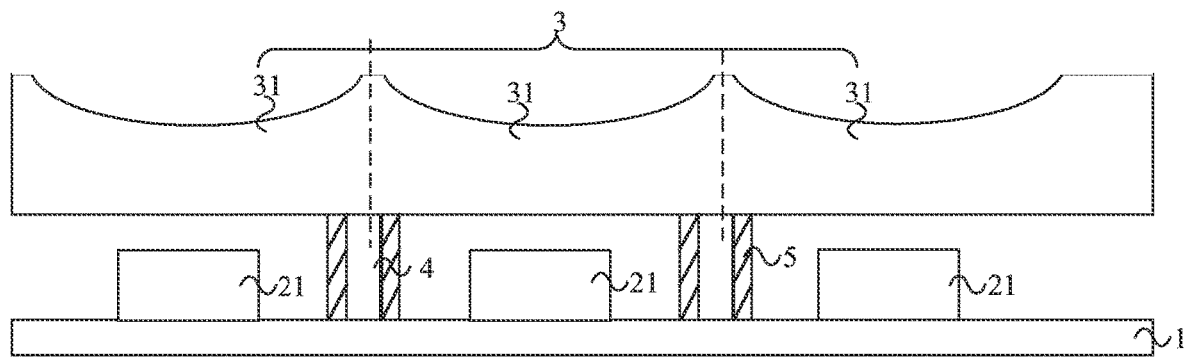
FIG. 6 is a schematic structural diagram of a LED display panel according to an embodiment of the present disclosure.

In an embodiment, the non-light-transmitting region 312 of each of the light filter regions 31 of the light filter layer 3 is only for the light-emitting source 21 disposed corresponding to the light filter region 31. That is, a light emitted by one certain light-emitting source 21 cannot pass through the non-light-transmitting region 312 of one corresponding light filter region 31, but lights emitted by the light-emitting sources 21 at other positions may be emitted through the non-light-transmitting region 312 corresponding to one adjacent light-emitting source 21. That is, the light may be emitted from the non-light-transmitting region 312, resulting in a larger viewing angle of the LED display panel. Therefore, as shown in FIG. 5 and FIG. 6, the LED display panel may further comprise one or more baffles 4 each disposed between two adjacent light-emitting sources 21. The baffles 4 are configured to prevent the light emitted by one certain light-emitting source 21 from entering the non-light-transmitting region 312 corresponding to one adjacent light-emitting source 21, so as to prevent the light from emitting from the non-light-transmitting regions 312 of the filter layer 3, thereby preventing the viewing angle from changing.

In an embodiment, as shown in FIG. 5 and FIG. 6, in order to ensure a light-blocking effect of the baffles 4, the baffles 4 are disposed between the substrate 1 and the light filter layer 3, one end of each of the baffles 4 is in contact with the substrate 1, and another end of each of the baffles 4 is in contact with the light filter layer 3.

Figure 7:
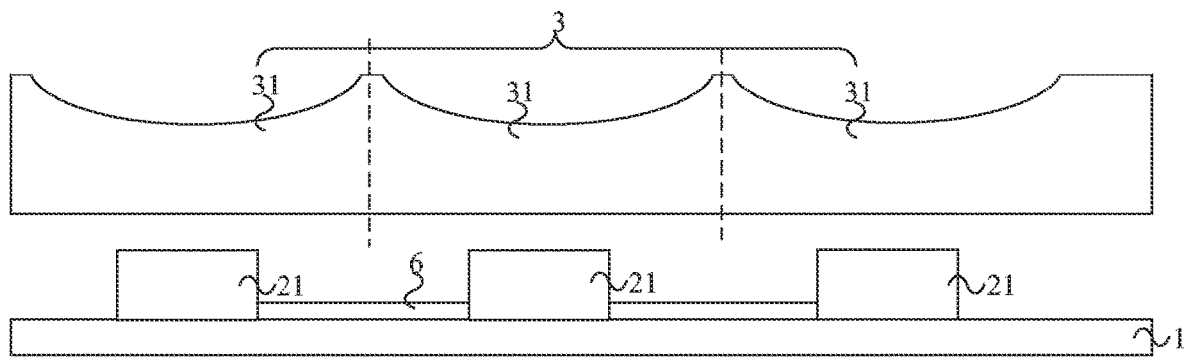
FIG. 7 is a schematic structural diagram of a LED display panel according to an embodiment of the present disclosure.

In addition, in order to increase a utilization rate of the light that is totally reflected and incident on the baffles 4, as shown in FIG. 6, two opposite sides of each of the baffles 4 may be provided with reflective films 5, which improves a reflectivity of the baffles 4 to light. In this way, the light that is totally reflected and incident on the baffles 4 is reflected again to the light-transmitting regions 311 of the light filter layer 3 as much as possible, so as to improve the utilization rate of the light. Furthermore, as shown in FIG. 7, the LED display panel may further comprise one or more reflective layers 6 each disposed between two adjacent light-emitting sources 21 and on the substrate 1 to improve the utilization rate of the light.

Figure 8:
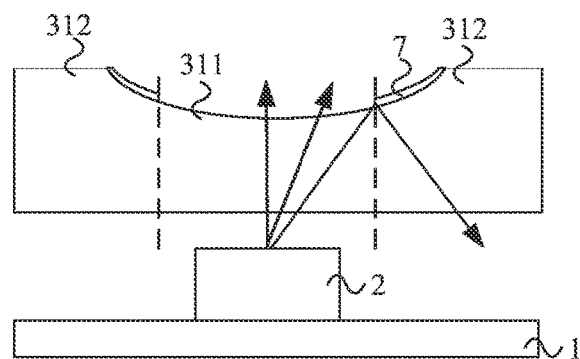
FIG. 8 is a schematic structural diagram of a LED display panel according to an embodiment of the present disclosure.

In an embodiment, in order to further ensure a filtering effect of the non-light-transmitting regions 312 of the light filter layer 3, as shown in FIG. 8, the non-light-transmitting regions 312 of the light filter layer 3 may be provided with non-light-transmitting coatings 7, for example, black coatings or the like.

The present disclosure further provides a display device. The display device comprises a plurality of LCD display panels arranged in an array and the LED display panel described in any one of the above embodiments. The LED display panel is disposed between adjacent LCD display panels. In addition, the display device further comprises, but is not limited to, other functional components that implement display functions, such as thin film transistors (TFT) and color filters. The other functional components may be selected and set according to different needs, which will not be described in detail in this embodiment.

A display viewing angle of LEDs is much greater than a display viewing angle of LCDs, so that there is a significant difference in brightness between the LEDs and the LCDs when viewed from a side. The LED display panel comprises a substrate 1, a light source assembly 2, and a light filter layer 3. The light source assembly 2 is disposed on the substrate 1, and the light filter layer 3 is disposed on the light source assembly 2. The light filter layer 3 comprises a light filter region 31. The light filter region 31 comprises a light-transmitting region 311 and a non-light-transmitting region 312. The non-light-transmitting region 312 is disposed outside the light-transmitting region 311. The light filter layer 3 further comprises a light incident surface and a light exit surface. A light emitted by the light source assembly 2 enters the light-transmitting region 311 and the non-light-transmitting region 312 of the light filter region 31 from the light incident surface. The light source assembly 2 is disposed at a position closer to the light-transmitting region 311 than the non-light-transmitting region 312, so that the light emitted by the light source assembly 2 is restricted to be emitted in a small range. For example, as shown in FIG. 1, the light emitted by the light source assembly 2 is limited to approximately a point. Therefore, when the light emitted by the light source assembly 2 enters the light exit surface, because a part of the light exit surface corresponding to the non-light-transmitting region 312 is farther than a part of the light exit surface corresponding to the light-transmitting region 311, an incident angle of the light emitted by the light source assembly 2 to the non-light-transmitting region 312 is greater than an incident angle of the light emitted by the light source assembly 2 to the light-transmitting region 311. By setting shapes of parts of the light exit surface corresponding to the light-transmitting region 311 and the non-light-transmitting region 312, a light incident angle at a boundary between the light-transmitting region 311 and the non-light-transmitting region 312 is set as a total reflection critical angle of the light filter layer 3. Therefore, the incident angle of the light emitted by the light source assembly 2 to the light-transmitting region 311 is less than the total reflection critical angle of the light filter layer 3, and the incident angle of the light emitted by the light source assembly 2 to the non-light-transmitting region 312 is greater than or equal to the total reflection critical angle of the light filter layer 3. That is, the light emitted by the light source assembly 2 is totally reflected when it enters the non-light-transmitting region 312 of the light filter layer 3. Therefore, the light emitted by the light source assembly 2 cannot be emitted from the non-light-transmitting region 312 of the light filter region 31, but can only be emitted from the light-transmitting region 311.

A position of a boundary between the light-transmitting region 311 and the non-light-transmitting region 312 of the light filter region 31 determines an exit angle of the light emitted by the light source assembly 2. By setting the boundary between the light-transmitting region 311 and the non-light-transmitting region 312 of the light filter region 31, the exit angle of the light emitted by the light source assembly 2 passing through the light-transmitting region 311 can be changed, which can adjust the viewing angle of the LED display panel. A viewing angle of the LCD display panels is relatively fixed. The viewing angle of the LED display panel is adjusted to be similar to or same as the viewing angle of the LCD display panels, so that the viewing angles of all display panels in the display device are less different or identical, and better display effects are obtained.

In some embodiments, the non-light-transmitting region 312 is disposed around the light-transmitting region 311.

In some embodiments, the light exit surface of the light filter layer 3 is an upper surface of the light filter layer 3, and a part of the upper surface corresponding to the light filter region 31 is shaped as a curved surface and/or a flat surface.

In some embodiments, a refractive index of the light filter layer 3 is greater than a refractive index of a medium outside the upper surface of the light filter layer 3.

In some embodiments, a centerline of the light-transmitting region 311 coincides with a centerline of the light source assembly 2.

In some embodiments, the light filter layer 3 is colorless and transparent.

In some embodiments, the light source assembly 2 comprises two or more light-emitting sources 21, and the light filter layer 3 comprises two or more light filter regions 31 disposed corresponding to the light-emitting sources 21.

In some embodiments, the LED display panel further comprises one or more baffles 4 disposed between the light-emitting sources 21.

In some embodiments, the baffles 4 are disposed between the substrate 1 and the light filter layer 3, one end of each of the baffles 4 is in contact with the substrate 1, and another end of each of the baffles 4 is in contact with the light filter layer 3.

In some embodiments, the non-light-transmitting region 312 of the light filter layer 3 is provided with a non-light-transmitting coating 7.

In the above embodiments, the description of each embodiment has its own emphasis. For parts not detailed in one embodiment, reference may be made to the related descriptions in other embodiments.

Technical features of the above embodiments can be combined arbitrarily. For the sake of brevity, all possible combinations of the technical features of the above embodiments are not described, and such combinations of the technical features shall be deemed to fall within the scope of the present disclosure as long as there is no contradiction.

The LED display panel and the display device provided by the present disclosure are described in detail above. The present disclosure uses specific examples to describe principles and implementations of the present invention. The above description of the embodiments is only for helping to understand solutions and core ideas of the present invention. Furthermore, those skilled in the art may make modifications to the specific embodiments and applications according to ideas of the present invention. In conclusion, the present specification should not be construed as a limitation to the present invention.

What is claimed is:

1. A Light Emitting Diode (LED) display panel, comprising:
    a substrate;
    a light source assembly disposed on the substrate; and
    a light filter layer disposed on the light source assembly, being colorless and transparent, and comprising a light filter region, wherein the light filter region comprises a light-transmitting region and a non-light-transmitting region, the non-light-transmitting region is disposed outside the light-transmitting region, an incident angle of a light emitted by the light source assembly to the light-transmitting region is less than a total reflection critical angle of the light filter layer, an incident angle of the light emitted by the light source assembly to the non-light-transmitting region is greater than or equal to the total reflection critical angle of the light filter layer, and the total reflection critical angle is a critical angle at which the light exits from an upper surface of the light filter layer.

2. The LED display panel according to claim 1, wherein the non-light-transmitting region is disposed around the light-transmitting region.

3. The LED display panel according to claim 1, wherein a part of the upper surface corresponding to the light filter region is shaped as a curved surface or a flat surface.

4. The LED display panel according to claim 3, wherein a refractive index of the light filter layer is greater than a refractive index of a medium outside the upper surface of the light filter layer.

5. The LED display panel according to claim 4, wherein a centerline of the light-transmitting region coincides with a centerline of the light source assembly.

6. The LED display panel according to claim 1, wherein the light source assembly comprises two or more light-emitting sources, the light filter layer comprises two or more light filter regions disposed corresponding to the light-emitting sources, and the LED display panel further comprises one or more baffles disposed between the light-emitting sources.

7. The LED display panel according to claim 6, wherein the baffles are disposed between the substrate and the light filter layer, one end of each of the baffles is in contact with the substrate, and another end of each of the baffles is in contact with the light filter layer.

8. A Light Emitting Diode (LED) display panel, comprising:
    a substrate;
    a light source assembly disposed on the substrate; and
    a light filter layer disposed on the light source assembly and comprising a light filter region, wherein the light filter region comprises a light-transmitting region and a non-light-transmitting region, the non-light-transmitting region is disposed outside the light-transmitting region, the non-light-transmitting region is provided with a non-light-transmitting coating, an incident angle of a light emitted by the light source assembly to the light-transmitting region is less than a total reflection critical angle of the light filter layer, an incident angle of the light emitted by the light source assembly to the non-light-transmitting region is greater than or equal to the total reflection critical angle of the light filter layer, and the total reflection critical angle is a critical angle at which the light exits from an upper surface of the light filter layer.

9. The LED display panel according to claim 8, wherein the non-light-transmitting region is disposed around the light-transmitting region.

10. The LED display panel according to claim 8, wherein a part of the upper surface corresponding to the light filter region is shaped as a curved surface or a flat surface.

11. The LED display panel according to claim 10, wherein a refractive index of the light filter layer is greater than a refractive index of a medium outside the upper surface of the light filter layer.

12. The LED display panel according to claim 11, wherein a centerline of the light-transmitting region coincides with a centerline of the light source assembly.

13. The LED display panel according to claim 8, wherein the light source assembly comprises two or more light-emitting sources, the light filter layer comprises two or more light filter regions disposed corresponding to the light-emitting sources, and the LED display panel further comprises one or more baffles disposed between the light-emitting sources.

14. The LED display panel according to claim 13, wherein the baffles are disposed between the substrate and the light filter layer, one end of each of the baffles is in contact with the substrate, and another end of each of the baffles is in contact with the light filter layer.

15. A display device, comprising a Light Emitting Diode (LED) display panel, the LED display panel comprising:
a substrate;
a light source assembly disposed on the substrate; and
a light filter layer disposed on the light source assembly and comprising a light filter region, wherein the light filter region comprises a light-transmitting region and a non-light-transmitting region, the non-light-transmitting region is disposed outside the light-transmitting region, an incident angle of a light emitted by the light source assembly to the light-transmitting region is less than a total reflection critical angle of the light filter layer, an incident angle of the light emitted by the light source assembly to the non-light-transmitting region is greater than or equal to the total reflection critical angle of the light filter layer, and the total reflection critical angle is a critical angle at which the light exits from an upper surface of the light filter layer; and
two or more Liquid Crystal Display (LCD) panels, wherein the LED display panel is disposed between adjacent LCD panels, and a light-emitting angle of the light emitted by the light source assembly passing through the light-transmitting region is similar to or same as a viewing angle of the LCD panels.

16. The display device according to claim 15, wherein the non-light-transmitting region is disposed around the light-transmitting region.

17. The display device according to claim 15, wherein a part of the upper surface corresponding to the light filter region is shaped as a curved surface or a flat surface.

18. The display device according to claim 17, wherein a refractive index of the light filter layer is greater than a refractive index of a medium outside the upper surface of the light filter layer.

19. The display device according to claim 18, wherein a centerline of the light-transmitting region coincides with a centerline of the light source assembly.

20. The display device according to claim 15, wherein the light filter layer is colorless and transparent.

* * * * *